United States Patent
Kawakita et al.

(10) Patent No.: US 6,924,985 B2
(45) Date of Patent: Aug. 2, 2005

(54) METHOD OF WATERPROOFING POWER CIRCUIT SECTION AND POWER MODULE HAVING POWER CIRCUIT SECTION

(75) Inventors: Shinji Kawakita, Mie (JP); Takahiro Onizuka, Aichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 201 days.

(21) Appl. No.: 10/610,877

(22) Filed: Jul. 2, 2003

(65) Prior Publication Data

US 2004/0004818 A1 Jan. 8, 2004

(30) Foreign Application Priority Data

Jul. 3, 2002 (JP) ........................................ 2002-194834

(51) Int. Cl.[7] ................................................ H05K 7/20
(52) U.S. Cl. ........................ 361/715; 361/601; 361/704; 318/722; 257/711
(58) Field of Search ........................ 361/601, 627–628, 361/730, 641–642, 704, 715; 174/17 R, 52.1; 257/678, 696, 707–718; 323/267; 363/131, 132, 16, 95, 98, 17, 39; 318/722, 800, 801–803, 434, 139; 165/80.2, 80.3, 165, 185

(56) References Cited

U.S. PATENT DOCUMENTS

| | | | | |
|---|---|---|---|---|
| 4,788,626 A | * | 11/1988 | Neidig et al. ................ 361/715 |
| 5,398,160 A | * | 3/1995 | Umeda ........................ 361/707 |
| 5,646,445 A | * | 7/1997 | Masumoto et al. ......... 257/723 |
| 5,814,765 A | * | 9/1998 | Bauer et al. ............. 174/50.54 |
| 6,215,679 B1 | * | 4/2001 | Yamane et al. ............. 363/132 |
| 6,265,840 B1 | * | 7/2001 | Wiezorek et al. ........... 318/434 |
| 6,313,598 B1 | * | 11/2001 | Tamba et al. ................ 318/722 |
| 6,327,165 B1 | * | 12/2001 | Yamane et al. ............. 363/132 |
| 6,369,411 B2 | * | 4/2002 | Matsumoto .................. 257/182 |
| 6,465,905 B1 | * | 10/2002 | Tsubaki ..................... 307/10.1 |
| 6,522,528 B2 | * | 2/2003 | Yamane ...................... 361/601 |
| 6,560,115 B1 | * | 5/2003 | Wakabayashi et al. ...... 361/728 |
| 6,724,627 B2 | * | 4/2004 | Onizuka et al. ............. 361/704 |
| 6,762,937 B2 | * | 7/2004 | Kimoto et al. .............. 361/699 |
| 2002/0074979 A1 | * | 6/2002 | Onizuka et al. ............. 323/267 |

FOREIGN PATENT DOCUMENTS

DE 004224720 A1 * 2/1994 ............ H05K/7/20
JP A 11-204700 7/1999

* cited by examiner

Primary Examiner—Michael Datskovskiy
(74) Attorney, Agent, or Firm—Oliff & Berridge, PLC

(57) ABSTRACT

A power module includes a heat radiating member, a power circuit section, a resin layer, and a case. The heat radiating member includes a circuit disposition surface. The power circuit section includes an external connection terminal and is disposed on the circuit disposition surface. The resin layer covers a part of the external connection terminal. The case is attached to the heat radiating member. The external connection terminal stands up from the heat radiating member. The case includes a hood, which has an opening at one end portion thereof. The external connection terminal is inserted into the hood. The resin layer prevents liquid from entering through the hood.

19 Claims, 4 Drawing Sheets

METHOD OF WATERPROOFING POWER CIRCUIT SECTION AND POWER MODULE HAVING POWER CIRCUIT SECTION

BACKGROUND OF THE INVENTION

1. Field of the Invention

The present invention relates to a method for waterproofing a power circuit section including a bus bar and a semiconductor device and disposed on a heat radiating member via an insulating layer, and more particularly to a method for waterproofing a power circuit section for distributing electric power from a common in-vehicle power source to a plurality of electronic units, and a power module having the power circuit section.

2. Description of the Related Art

Conventionally, as means for distributing electric power from the common in-vehicle power source to the plurality of electronic units, an electrical connection box is well-known in which a plurality of bus bar boards are laminated to constitute the power circuit section and into which a fuse and a relay switch are incorporated.

Generally, such electrical connection box has the power circuit section accommodated within a case including an upper case and a lower case. From a viewpoint of preventing the short-circuit, the lower case and the upper case are fitted together water-tightly to waterproof the inside of the case.

In recent years, in order to miniaturize the electrical connection box and realize high-speed switching control, a power module has been developed in which a semiconductor switching device such as FET is interposed between an input terminal and an output terminal, instead of the relay. From a viewpoint of cooling a heat generated by the semiconductor device, a power module has been proposed in which the power circuit section is disposed via an insulating layer on a circuit disposition surface of the heat radiating member (e.g., JP-A-11-204700).

In such power module, a method for forming an external connection terminal connected to an external circuit includes bending up an end portion of a bus bar provided in the power circuit section disposed on the circuit disposition surface to form the external connection terminal connected to an external connector. However, in this structure, the connecting direction is limited to the normal direction to the circuit disposition surface. Thus, to make the connecting direction parallel to the circuit disposition surface, it is conceived to extend the end portion of the bus bar straightly from the power circuit section. However, in this case, the external connection terminal is located near the circuit disposition surface of the heat radiating member, bringing about a danger of causing a short-circuit when there is a large current or a large voltage, even though the external connection terminal and the heat radiating member are separated apart. Also, there is a problem that a proper insulation between the external connection terminal and the heat radiating member is not secured when they make contact with each other temporarily due to vibration. Also, when the external connection terminal is disposed near the circuit disposition surface of the heat radiating member, there is another problem that it is difficult to form a connector by surrounding the external connection terminal with the hood.

On the other hand, in the above power module, it is necessary to prevent the short-circuit, as in the conventional electrical connection box. Accordingly, though it is required to waterproof its circuit section, no specific method of waterproofing has been disclosed.

SUMMARY OF THE INVENTION

It is an object of the invention to provide a method for waterproofing a power circuit section and a power module having the power circuit section, in which it is possible to keep a proper insulation in connecting an external connection terminal in a direction almost parallel to a circuit disposition surface and easily form a connector, so that the power circuit section is waterproofed in an effective and simple manner.

In order to achieve the above object, a method according to embodiments of the invention waterproofs a power circuit section disposed on a circuit disposition surface of a heat radiating member. The method includes forming the power circuit section including an external connection terminal having a standing portion, which stands up from the circuit disposition surface and a extending portion, which extends from an end portion of the standing portion to outside in parallel with the circuit disposition surface; manufacturing a case including a hood surrounding an end portion of the extending portion and opening in parallel with the circuit disposition surface, a concave portion formed at a bottom portion of the hood, one end portion thereof opening toward a heat radiating member side, and an assembling through hole formed at a peripheral wall of the hood on the heat radiating member side, wherein an end portion of the extending portion of the external connection terminal can be inserted into the assembling through hole; inserting the external connection terminal into the concave portion and the assembling through hole to accommodate the external connection terminal in the hood and the concave portion, and assembling the case with the heat radiating member in a state where a seal member surrounds a part of the power circuit section except for the external connection terminal and is interposed between the case and the heat radiating member; and turning the hood to open upward, and filling a resin into a space surrounded by the concave portion and the heat radiating member up to a height at which the resin covers a base portion of the external connection terminal including the standing portion.

With this constitution, the power circuit section is formed with the external connection terminal having the standing portion standing up from the circuit disposition surface and the extending portion extending almost in parallel with the circuit disposition surface toward the outside. Therefore, when an outside terminal is connected with the external connection terminal in a direction being almost parallel to the circuit disposition surface, the extending portion is disposed apart from the heat radiating member owing to the standing portion. Whereby, it is possible to prevent the short-circuit in the extending portion of the external connection terminal. The external connection terminal including the standing portion is received in a space defined by the concave portion and the heat radiating member and a waterproof resin is filled into the space up to a height of covering the base end portion of the external connection terminal, whereby the waterproof resin takes the role of the insulating layer to prevent the short-circuit from occurring near the circuit disposition surface. Accordingly, the external connection terminal is securely insulated from the heat radiating member over a range from the extending portion to the standing portion. Also, since the hood is provided to surround the top end portion of the extending portion, it is securely separated from the circuit disposition surface of the heat radiating member, whereby the connector is easily formed. Moreover, since the case is assembled with the heat radiating member via the seal member in the form of enclosing the power circuit section inward of the external connection terminal, the power circuit section inward of the external connection terminal, or the power circuit section excluding the external connection terminal, is securely waterproofed by the case and the heat radiating member. On the other hand, though there is a fear that the water may enter the power circuit section through the external connection terminal not sealed by the case and the heat radiating member, this external connection terminal is received within the hood and the concave portion provided in the case in assembling the case, and the waterproof resin is filled into the concave portion up to the height of covering the base end portion of the external connection terminal, whereby the base end portion of the external connection terminal including the standing portion is sealed water-tightly by the waterproof resin to securely prevent the water from entering the power circuit section. Accordingly, the power circuit section is effectively waterproofed in a simple manner. In this way, since the external connection terminal is incorporated into the hood through the assembling insertion hole and the concave portion with one end opened, which are provided within the hood, the case is easily assembled with the heat radiating member by operating the case in one axial direction (normal direction of the circuit disposition surface), resulting in more excellent assembling workability.

In the embodiments of this invention, the resin filled into the space defined by the concave portion and the heat radiating member is not specifically limited, but may be preferably epoxy resin from a viewpoint of universality and durability.

Also, in the embodiments of this invention, in the case manufacturing step, a groove for receiving the standing portion may be formed at a bottom portion of the concave portion. With this constitution, the external connection terminal is securely positioned by the groove.

Moreover, in the assembling step, the seal member may be formed by heat curing an adhesive including a thermosetting resin. With this constitution, the seal member is formed by the adhesive to provide a seal between the case and the heat radiating member, thereby securely enclosing an interstice between both members due to viscosity of the adhesive. Since the seal member is formed by thermally curing the adhesive, both members are more securely sealed, whereby it is possible to waterproof the power circuit section more effectively in a simple manner.

Moreover, according to the embodiments of the invention, a power module includes a heat radiating member having a circuit disposition surface; a power circuit section having an external connection terminal and disposed on the circuit disposition surface; a seam member surrounding at least a part of the power circuit section except for the external connection terminal; and a case attached to the heat radiating member in a state where the seal member is interposed therebetween. The external connection terminal includes a standing portion standing up from the circuit disposition surface, an extending portion extending from an end portion of the standing portion to outside of the power circuit section in parallel with the circuit disposition surface. The case includes a hood surrounding an end portion of the extending portion and opening in parallel with the circuit disposition surface, and a concave portion opening toward a heat radiating member side at a bottom portion of the hood. A resin is filled into a space surrounded by the concave portion and the heat radiating member up to a height at which the resin covers a base portion of the external connection terminal including the standing portion.

With this constitution, the extending portion is disposed apart from the heat radiating member owing to the standing portion, whereby it is possible to securely prevent the short-circuit in the extending portion. Since the waterproof resin is filled into the base end portion of the external connection terminal including the standing portion, a waterproof layer with this waterproof resin has a function of the insulating layer, whereby it is possible to securely prevent the short-circuit from occurring near the circuit disposition surface, and keep the secure insulation with the external connection terminal. Also, since the case is assembled with the heat radiating member via the seal member in the form of enclosing the power circuit section inward of the external connection terminal, the power circuit section excluding the external connection terminal is securely waterproofed. On the other hand, the external connection terminal not sealed by the case and the heat radiating member is received within the hood and the concave portion provided in the case in assembling the case, and the waterproof resin is filled into the concave portion up to the height of covering the base end portion of the external connection terminal, whereby the base end portion of the external connection terminal including the standing portion is sealed water-tightly by the waterproof resin to securely prevent the water from entering the power circuit section. Accordingly, the power circuit section is effectively waterproofed in a simple manner.

DETAILED DESCRIPTION OF THE PREFERRED EMBODIMENTS

The preferred embodiments of the present invention will be described below with reference to the accompanying drawings. Herein, described will be a power circuit section for distributing an electric power supplied from a common power source mounted on the vehicle to a plurality of electrical loads. However, the invention is not limited thereto. The invention may be widely applied to various power circuit sections for which heat radiation and waterproofing are required.

Figure 1:
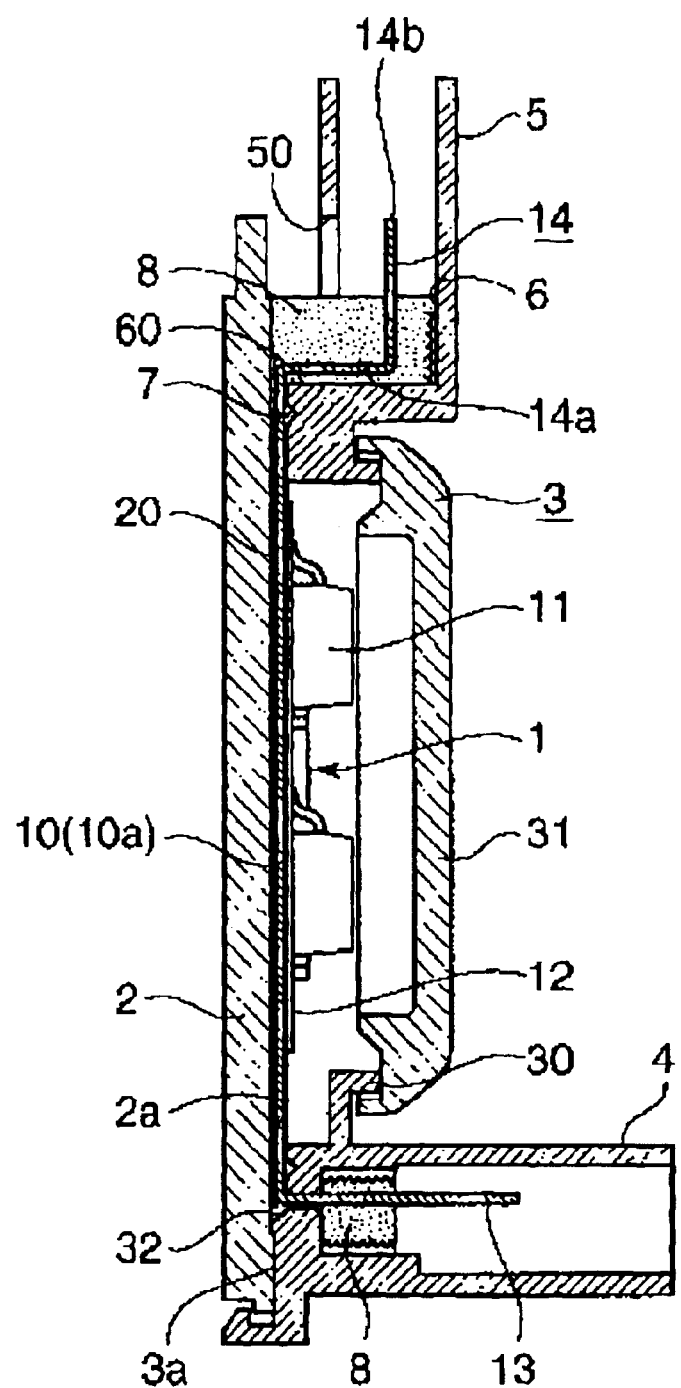
FIG. 1 is a cross-sectional view showing a power module with a waterproofing method for power circuit section according to an embodiment of the present invention.
Figure 2:
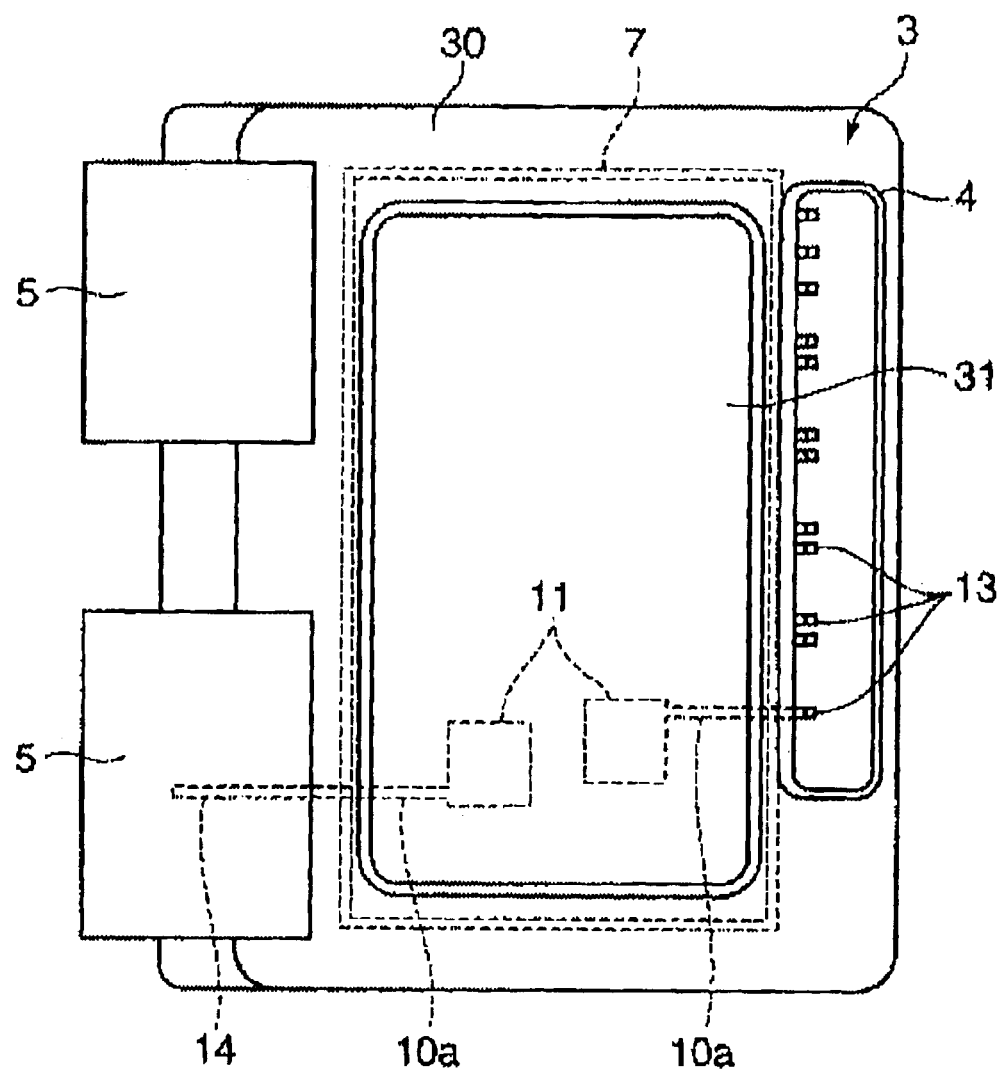
FIG. 2 is a plan view of the power module.

FIG. 1 is a cross-sectional view showing a power module including a power circuit section, which is waterproofed by a waterproofing method according to an embodiment of the present invention. Also, FIG. 2 is a plan view showing this power module. This power module is mounted on the vehicle vertically, that is, with a left end portion of FIG. 2 placed upwards in this embodiment. However, the power module may be mounted on the vehicle in other directions. In the following explanation, this power module is mounted vertically, but this is only convenience sake for specifying relative direction between members.

1) Power Circuit Section Forming Step

First of all, a power circuit section 1 of the embodiment is formed.

That is, the power circuit section 1 includes a bus bar configuration plate 10, a plurality of FETs 11, and a control circuit board 12. In the bus bar configuration plate 10, a plurality of bus bars 10a are arranged in a plane area having an approximately rectangular shape in a predetermined pattern, in this embodiment in a pattern in which end portions of the bus bars 10a project from both side edges of the plane area (upper and lower side edges of the plane area in FIG. 1). The FETs 11 are semiconductor switching devices interposed between an input terminal bus bar 10a and an output terminal bus bar 10a among the bus bars 10a making up the bus bar configuration plate 10. The control circuit board 12 is bonded to one face (a right face in FIG. 1) of the bus bar configuration plate 10 and has a control circuit for controlling the switching operation of the FETs 11. The FETs 11 are electrically connected to both the bus bar configuration plate 10 and the control circuit board 12. Also, this power circuit section 1 has a plurality of external connection terminals 13 and 14 to which an outside terminal can be connected in a desired direction. At least one of the external connection terminals 13 and 14 allows the outside terminal to be connected in a direction almost parallel to the plane area of the bus bar configuration plate 10 (upwards in FIG. 1). Herein, the direction parallel to the plane area means being parallel to the plane area on which the bus bars 10a are arranged. When the electronic circuit section 1 is disposed on a circuit disposition surface 2a of a heat radiating member 2 (described later), this direction is coincident with a direction parallel to a circuit disposition surface 2a, that is, a direction perpendicular to a normal direction of the circuit disposition surface 2a.

The shape of the bus bar configuration plate 10 or the arrangement pattern of the bus bars 10a may be appropriately altered. The FETs 11 may be replaced with other semiconductor switching devices or semiconductor devices other than the switching devices. Moreover, the control circuit board 12 may be disposed on top of the FETs 11.

The external connection terminal 13, 14 is formed by bending a predetermined bus bar 10a. In this embodiment, the external connection terminals 13 and 14 include a first external connection terminal 13 of I-character shape that is oriented to the normal direction (sideways in FIG. 1) of the plane area of the bus bar configuration plate 10 and a second external connection terminal 14 of L-character shape that is oriented perpendicularly to the normal direction of the plane area of the bus bar configuration plate 10 (upwards in FIG. 1).

Figure 4:
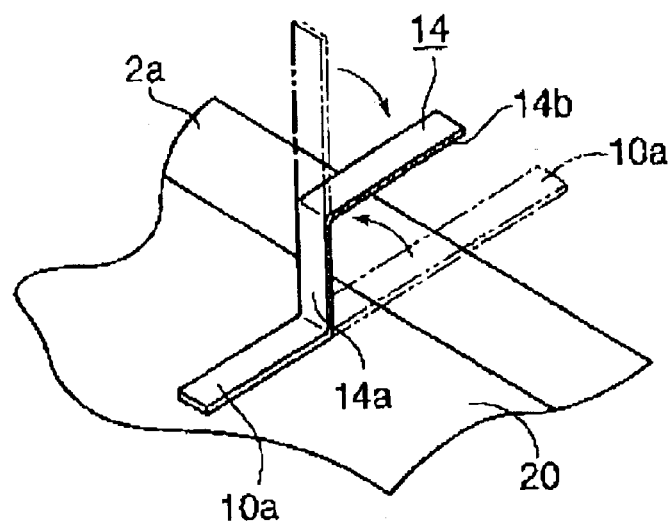
FIG. 4 is an explanatory view showing a bent state of a bus bar.

More specifically, the first external connection terminal 13 is formed by bending vertically an end portion of a bus bar 10a arranged at the lower edge (right edge in FIG. 2) of the power circuit section 1 among the bus bars 10a. On the other hand, the second external terminal 14 having an L shape is formed by bending an end portion of a bus bar 10a arranged at the upper edge (left edge in FIG. 2) of the power circuit section 1 and bending back a leading end portion of a standing portion thereof to be in parallel to the bus bar configuration plate 10, that is, in a direction perpendicular to the normal direction of a plane area (upwards in FIG. 1), as shown in FIGS. 1 and 4. That is, this second external connection terminal 14 includes a standing portion 14a standing from the plane area and an extending portion 14b extending almost parallel to the circuit disposition surface 2a from the top end of the standing portion 14a to the outside (upwards in FIG. 1), in which an outside terminal is connected from upwards. In this second external connection terminal 14, the end portion of the bus bar 10a is bent by one or more operations.

The external connection terminals 13 and 14 serve as an input terminal, an output terminal or a signal input terminal. An outside terminal is electrically connected with each of the external connection terminals 13 and 14. The first and second external connection terminals 13 and 14 are distinguished not by the type of input/output terminal or signal input terminal, but by a direction to which the top end portion is directed. Accordingly, the first and second external connection terminals 13 and 14 may involve any of the input terminal, output terminal and signal input terminal as described above.

In this way, the second external connection terminal 14 is formed in the L shape, that is, the second external connection terminal 14 is formed to include the standing portion 14a standing on the plane area and the extending portion 14b extending almost parallel to the plane area from the top end of the standing portion 14a to the outside. Therefore, when the power circuit section 1 is disposed on the circuit disposition surface 2a, the extending portion 14b of the second external connection terminal 14 is disposed apart from the heat radiating member 2 to securely prevent the short-circuit from occurring in the extending portion 14b, as will be described later. That is, if the external connection terminal is disposed on the same plane as the power circuit section 1, this external connection terminal is located near the circuit disposition surface 2a of the heat radiating member 2, whereby there is a risk of causing the short-circuit when there is a large current or voltage, even though the external connection terminal and the heat radiating member 2 are separated away. However, in this embodiment, the second external connection terminal 14 is provided with the standing portion 14a, whereby the extending portion 14b and the heat radiating member 2 are fully separated to securely prevent the short-circuit from occurring in the extending portion 14b.

2) Step of Disposing the Power Circuit Section

The power circuit section 1 is disposed via an insulating layer 20 on the circuit disposition surface 2 of the heat radiating member 2, as shown in FIGS. 1 and 2. That is, the power circuit section 1 is bonded by an adhesive having excellent thermal conductivity or is disposed on the circuit disposition surface 2a of the heat radiating member 2 via the insulating layer 20 by screwing the bus bar 10a with the heat radiating member 2, when some of the bus bars 10a should be grounded.

The heat radiating member 2 disposed on the power circuit section 1 is totally made of a material having excellent thermal conductivity such as aluminum metal, and has an upper face formed flat to constitute the circuit disposition surface 2a. On the other hand, the insulating layer 20 interposed between this heat radiating member 2 and the power circuit section 1 is provided in a central area of the circuit disposition surface 2a of the heat radiating member 2, corresponding to the power circuit section 1. The insulating layer 20 is thermally connected to the heat radiating member 2. This insulating layer 20 is formed by coating and drying an adhesive having high insulating property (e.g., epoxy resin or silicone adhesive), or bonding an insulating sheet on the circuit disposition surface 2a, for example.

This heat radiating member 2 may have a plurality of radiating fins arranged as a row on the opposite side of the circuit disposition surface 2a to improve the heat radiation efficiency.

3) Case Fabrication Step

To waterproof the power circuit section 1 disposed on the circuit disposition surface 2a of the heat radiating member 2, the case 3 is fabricated to cover a predetermined range of the power circuit section 1 on the circuit disposition surface 2a.

This case 3 is made of an insulating material, and has a box-like shape that is open to one side (left side in FIG. 1)

and covers the predetermined range of the power circuit section 1 from the opposite side (right side in FIG. 1) of the heat radiating member 2. The case 3 includes a case main body 30 making up peripheral walls, and a case main body ceiling lid 31 that closes an upper end opening portion (right end opening portion in FIG. 1) of the case main body 30.

Figure 5:
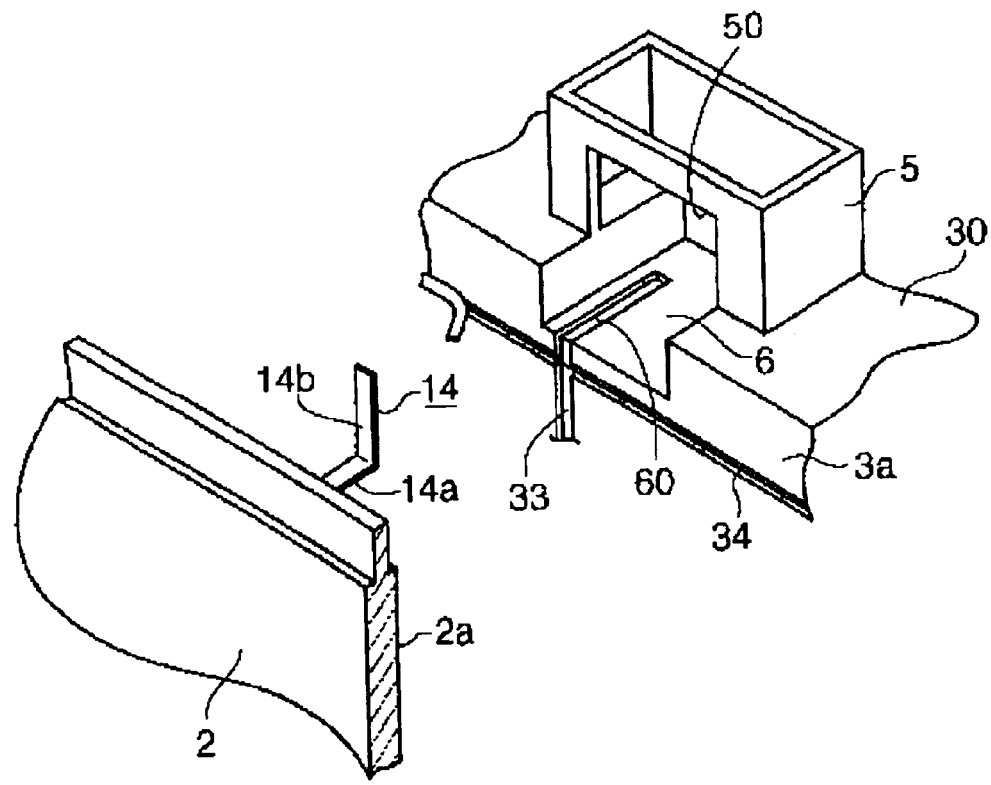
FIG. 5 is an explanatory view showing an assembled state of a case and a heat radiating member.

This case main body 30 has a superposition surface 3*a* of an almost rectangular and annular shape, which is superposed on the circuit disposition surface 2*a* of the heat radiating member 2. The superposition surface 3*a* includes a plurality of terminal through holes 32, a bus bar receiving groove portion 33, and an enclosure groove 34 as shown in FIGS. 1 and 5. The terminal through holes 32 penetrate in the normal direction of the superposition surface 3*a* and are formed to correspond to the first external connection terminals 13. The corresponding first external connection terminals 13 are inserted into the terminal through holes 3*a*, respectively. The bus bar receiving groove portion 34 is formed to correspond to the second external connection terminal 14 and is formed to traverse the superposition surface 3*a*. The enclosure groove 34 encloses the power circuit section 1 except for the first and second external connection terminals 14.

The bus bar receiving groove 33 receives the bus bar 10*a* extending to the second external connection terminal 14, which protrudes from the case 3, as will be described later. The bus bar receiving groove 33 is formed to assimilate all or a part of gap between the case 3 and the heat radiating member 2, caused by the bus bar 10*a* between the case 3 and the heat radiating member 2. Accordingly, this bus bar receiving groove 33 is provided in view of the thickness of the bus bar 10*a*.

The enclosure groove 34 is formed like almost rectangular and annular shape along the superposition surface 3*a* to enclose a predetermined range of the power circuit section 1, that is, an area of the power circuit section 1 containing at least the FETs 11 and being inside the first and second external connection terminals 13 and 14, as previously described. The sectional shape of the enclosure groove 34 is not specifically limited. In this embodiment, the sectional shape of the enclosure groove 34 is an almost V shape. Also, the enclosure groove 34 is filled with an adhesive containing a thermosetting resin along the groove as described later. The depth of the enclosure groove is appropriately set in view of the adhesive to be filled.

On the other hand, first and second hoods 4 and 5 for connector formation are provided on a face of the case main body 30 opposite to the superposition surface 3*a* and a side face at an upper end of the case main body 30. The first and second hoods 4 and 5 are formed to correspond to the first and second external connection terminals 13 and 14 of the power circuit section 1. That is, a barrel-like first hood 4 is provided to protrude-sideways at the lower end portion of the case main body 30 as shown in FIG. 1. The first external connection terminal 13 of the power circuit section 1 projects into the first hood 4 through the terminal through hole 32. On the other hand, the second hood 5 is provided to protrude upwards at the upper end portion of the case main body 30. The top end portion of the extending portion 14*b* of the second external connection terminal 14 of the power circuit section 1 is received within the second hood 5.

The first hood 4 and its corresponding one or more first external connection terminals 13, and the second hood 5 and its corresponding one or more second external connection terminals 14 constitute external connectors, with which another connector is connectable, respectively. The sectional shape of the first and second hoods 4 and 5 may be appropriately set in view of the shape of another connector to be connected.

Figure 3:
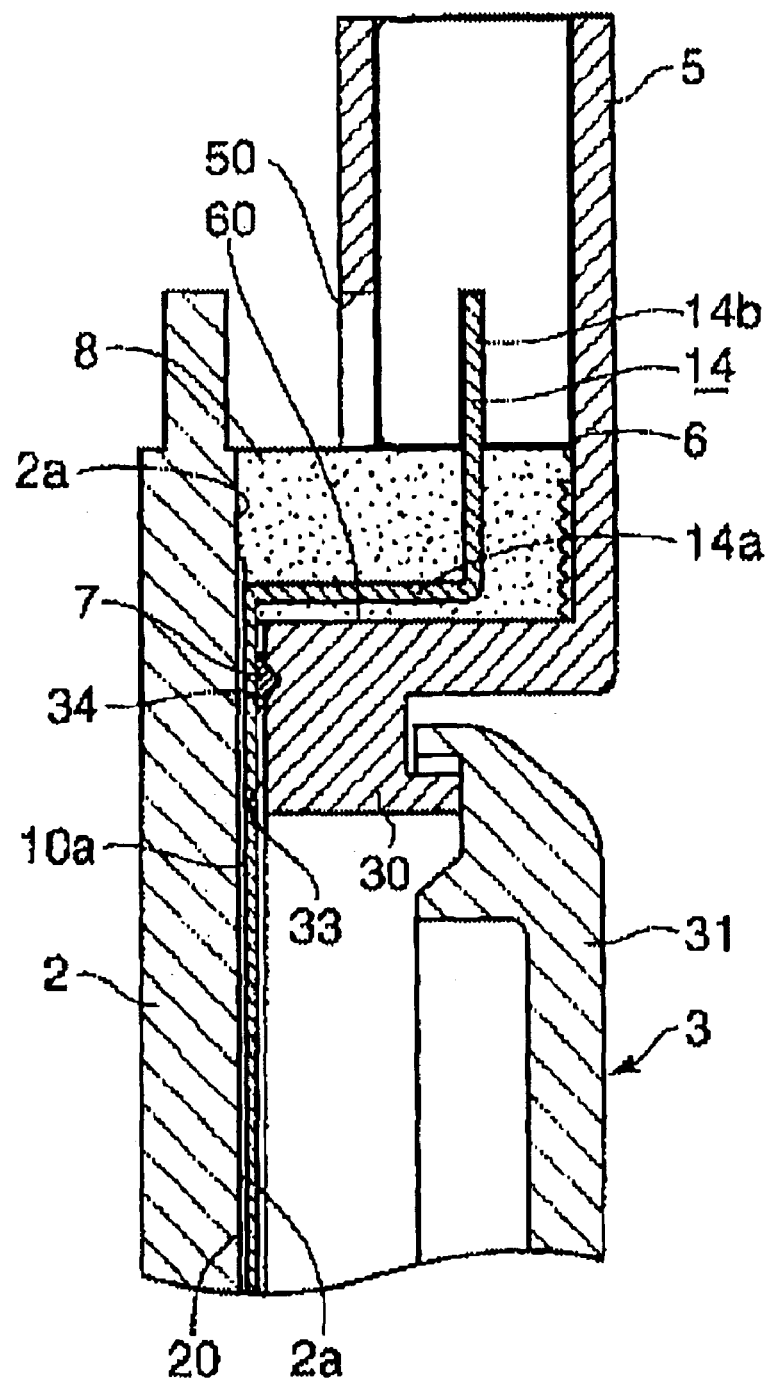
FIG. 3 is an enlarged view of the essence of FIG. 1.

As clearly shown in FIGS. 3 and 5, the case main body 30 includes a concave portion 6 for filling a resin, one end of which open to a side of the heat radiating member 2 and which is formed on a bottom portion of the second hood 5. In other words, the concave portion 6 of one end open type is provided to extend from the superposition surface 3*a* of the case main body 30 to the bottom portion of the second hood 5 at an end portion of the heat radiating member 2 on the peripheral wall of the case main body 30. When the case 3 and the head radiating member 2 is assembled, a vessel, which is filled with the waterproof resin, is formed between this concave portion 6 and the circuit disposition surface 2*a* of the heat radiating member 2. This concave portion 6 receives the standing portion 14*a* of the second external connection terminal 14 on its bottom portion, and particularly in this embodiment, a standing portion receiving groove 60 is provided to extend from the side edge of the heat radiating member 2 on the bottom portion thereof to receive the standing portion 14*a* of the second external connection terminal 14, as shown in FIG. 5. The depth of the standing portion receiving groove 60 may be appropriately set in view of the thickness of the standing portion 14*a*. In this way, the standing portion 14*a* is received within the standing portion receiving groove 60, whereby the second external connection terminal 14 is easily and correctly positioned with respect to the second hood 5.

The second hood 5 includes an assembling insertion hole 50 into which the top end portion of the second external connection terminal 14 is inserted from sideways at a time of assembling the case 3 with the heat radiating member 2, as will be described later. That is, the assembling insertion hole 50 is provided on the peripheral wall of the second hood 5 on the side of the heat radiating member 2, so that the height of the concave portion 6 from the bottom is set to correspond to at least the length of the extending portion 14*b*, thereby allowing a corresponding portion of the second external connection terminal 14 projecting out of the concave portion 6 to be inserted from sideways.

The case main body ceiling lid 31 is formed in an almost rectangular shape corresponding to an opening portion of the case main body 30, and attached on the case main body 30 by bonding or welding in an assembling step as will be described later.

In this way, in assembling the case, the second external connection terminal 14 is inserted into the second hood 5 through the assembling insertion hole 50 provided on the second hood 5 and the concave portion 6 one end of which opens. Whereby, the case 3 is easily assembled with the heat radiating member 2 by operating it in one axial direction (in the normal direction of the circuit disposition surface 2*a*), resulting in enhanced assembling efficiency.

4) Assembling Step

The case 3 fabricated at the case fabrication step is assembled with the heat radiating member 2.

That is, first of all, an adhesive is filled in the enclosure groove 34 in the case main body 30 of the case 3. More specifically, an adhesive containing a thermosetting resin (e.g., silicone resin) is filled in the enclosure groove 34, as shown in FIG. 5.

Then, the heat radiating member 2 on which the power circuit section 1 is disposed is assembled with the case main body 30 in which the adhesive is filled in the enclosure groove 34. A seal member 7 is formed between the case main body 30 and the heat radiating member 2 to seal both members 2 and 30. More specifically, firstly, the adhesive is filled in the enclosure groove 34 of the case main body 30 uniformly. Then, the second external connection terminal 14 is inserted through the concave portion 6 and the assembling insertion hole 50 of the case main body 30 and received within the second hood 5 and the concave portion 6, while the circuit disposition surface 2*a* of the heat radiating member 2 is superposed on the superposition surface 3*a* of the case main body 30. When the case main body 30 and the heat radiating member 2 that are assembled are heated, the adhesive containing the thermosetting resin is cured, so that the seal member 7 is formed. That is, the case main body 30 and the heat radiating member 2 are sealed through the seal forming step of forming the seal member by adhesive.

The seal member 7 formed of the thermally cured adhesive has an almost rectangular and annular shape to surround the predetermined range of the power circuit section 1, in this embodiment, the area of the power circuit section 1 inside the first and second external connection terminals 14. The seal member 7 is interposed between the heat radiating member 2 and the case main body 30 in a state where the seal member 7 is bonded to both the members 7 and 30.

After this seal forming step, the opening of the case main body 30 opposite to the heat radiating member 2 is turned upwards and an appropriate potting agent is filled through the opening to seal the inside of the case main body 30.

After this potting step, the case main body ceiling lid 31 is attached on the case main body 30 by bonding or welding, in a state where the opening of the case main body 30 opposite to the heat radiating member 2 is closed.

Thus, the case 3 in which the case main body ceiling lid 31 is attached on the case main body 30 is assembled with the heat radiating member 2 with the seal member 7 interposed therebetween.

In this way, since the case 3 is assembled with the heat radiating member 2 via the seal member 7 having the shape of enclosing the area of the power circuit section 1 inside the first and second external connection terminals 13 and 14, the power circuit section inside the external connection terminals 13 and 14, that is, the power circuit section 1 except for the external connection terminals 13 and 14 is securely waterproofed by the case 3 and the heat radiating member 2. Accordingly, the power circuit section 1 except for the external connection terminals 13 and 14 is effectively waterproofed in a simple manner. Since the heat generated by the power circuit section 1 is sufficiently radiated by the heat radiating member 2, the power circuit section 1 keeps a high performance. Also, since the power circuit section 1 is not contained within a vessel, but is disposed on the circuit disposition surface 2a of the heat radiating member 2 and covered with the case 3, the power circuit section is made smaller than the conventional electrical connection box having the upper case and the lower case.

Also, since the potting agent is poured into the inside of the case main body 30, the power circuit section 1 is covered with the potting agent for effective heat radiation. When the potting agent having waterproof property is poured, the power circuit section 1 is waterproofed more securely.

5) Terminal Waterproofing Step

After the assembling step, a waterproof resin is filled through the openings of the first and second hoods 4 and 5 up to a predetermined height. The waterproof resin forms a waterproof layer 8. At this time, the first and second external connection terminals 13 and 14 project a certain length from the waterproof layers 8. This waterproof resin is not specifically limited, but may be epoxy resin from the viewpoint of universality and durability.

More specifically, the power module is set to open the first hood 4 upwards, and the waterproof resin is filled in the first hood 4 in this state. The waterproof layer 8 is formed of this waterproof resin to seal the base end portion of the first external connection terminal 13 and the terminal through hole 32.

On the other hand, before or after forming the waterproof layers 8 by filling the waterproof resin in the first hood 4, the power module is set to open the second hood 5 upwards as shown in FIG. 3. In this state, the waterproof resin is filled into a space defined by the concave portion 6 beneath the second hood 5 and the heat radiating member 2. The waterproof layer 8 is formed of this waterproof resin to seal the bus bar receiving groove 33, as well as the base end portion of the second external connection terminal 14 including the standing portion 14a within the waterproof layer 8.

In this way, with regard to the first and second external connection terminals 13 and 14, which are not sealed by the case 3 and the heat radiating member 2, in assembling the case 3, the first external connection terminal 13 is received in the first hood 4 and the waterproof resin is filled on the bottom of the first hood 4, and the second external connection terminal 14 is received within the second hood 5 and the concave portion 6 and the waterproof resin is filled in the concave portion 6 to cover the base end portion of the external connection terminal. Therefore, the base end portion of the first external connection terminal 13 and the base end portion of the second external connection terminal 14 including the standing portion 14a are sealed water-tightly by the waterproof resin to securely prevent water from entering the power circuit section 1. Since the base end portion of the second external connection terminal 14 is covered with the waterproof resin, the waterproof resin takes the role of the insulating layer 20 to securely prevent the short-circuit from occurring near the circuit disposition surface 2a.

Though the waterproofing method for the power circuit section 1 according to this embodiment has been described above, the waterproofing method of this invention is not limited to the above embodiment. Various modifications may be made without departing from the gist of the invention. For example, the following changes may be possible.

The order of the above steps is not limited to that of the embodiment. The terminal waterproofing step may be conducted in the assembling step, namely, after assembling the case main body 30 with the heat radiating member 2 and before the potting step, for example. However, the terminal waterproofing step should be made after the potting step from the viewpoint of forming the desired waterproof layer securely.

In the above embodiment, the seal member 7 is formed by heat curing the adhesive. However, the method for forming the seal member is not limited thereto. For example, the seal member may be formed in such a way that the heat radiating member is assembled with the waterproof case and left for a certain period of time to cure the adhesive naturally.

As above described, with this invention, since the external connection terminal has the standing portion and the extending portion, the extending portion is separated from the heat radiating member owing to the standing portion, whereby it is possible to securely prevent the short-circuit from occurring in the extending portion. Since the base end portion of the external connection terminal including the standing portion is filled with the waterproof resin, which takes the role of the insulating layer, it is possible to prevent the short-circuit from occurring near the circuit disposition surface. Accordingly, when the extending portion of the external connection terminal is provided parallel to the circuit disposition surface, it is possible to keep a secure insulation.

Also, since the hood is provided to surround the top end portion of the extending portion, it is securely separated from the circuit disposition surface of the heat radiating member, whereby the connector is easily formed.

Moreover, the power circuit section excluding the external connection terminals is securely waterproofed by the case and the heat radiating member. On the other hand, of the external connection terminals not sealed by the case and the heat radiating member, the base end portion of the external connection terminal including the standing portion is sealed water-tightly by the waterproof resin to securely prevent the water from entering the power circuit section. Accordingly, the power circuit section is effectively waterproofed in a simple manner.

In this way, since the external connection terminal is incorporated into the hood through the assembling insertion hole and the concave portion with one end opened, which are provided within the hood, the case is easily assembled with the heat radiating member by operating the case in one axial direction (normal direction of the circuit disposition surface), resulting in more excellent assembling efficiency.

What is claimed is:

1. A power module comprising:
   a heat radiating member including a circuit disposition surface;
   a power circuit section including an external connection terminal and disposed on the circuit disposition surface;
   a resin layer covering a part of the external connection terminal; and
   a case attached to the heat radiating member, wherein:
   the external connection terminal stands up from the heat radiating member;
   the case includes a hood, which has an opening at one end portion thereof;
   the external connection terminal is inserted into the hood; and
   the resin layer prevents liquid from entering through the hood.

2. The power module according to claim 1, wherein:
   the other end portion of the hood is filled with the resin layer;
   the case further includes a through hole, which communicate the hood and a power circuit section side; and
   the external connection terminal passes through the through hole.

3. The power module according to claim 2, wherein the case further includes a groove through which the external connection terminal passes.

4. The power module according to claim 2, further comprising a seal member surrounding at least a part of the power circuit section and interposed between the heat radiating member and the case.

5. The power module according to claim 2, wherein:
   the power circuit section includes a bus bar; and
   the external connection terminal is a part of the bus bar.

6. The power module according to claim 2, further comprising a lid attached to the case,
   wherein the power circuit section is covered with another resin layer.

7. The power module according to claim 2, wherein the power module is an in-vehicle power module.

8. The power module according to claim 1, wherein:
   the external terminal includes:
      a standing portion, which stands up from the circuit disposition surface; and
      a extending portion, which extends in parallel with the circuit disposition surface;
   the case further includes a concave portion at a bottom portion of the hood, a part of the concave portion opens toward the heat radiating member; and
   a space defined by the concave portion and the heat radiating member is filled with the resin layer at least partially.

9. The power module according to claim 8, wherein the resin layer covers the whole standing portion and a part of the extending portion.

10. The power module according to claim 8, wherein:
    the other end portion of the hood communicates with the concave portion of the case; and
    the hood extends in parallel with the circuit disposition surface.

11. The power module according to claim 8, wherein the case further includes a groove through which the external connection terminal passes.

12. The power module according to claim 8, further comprising a seal member surrounding at least a part of the power circuit section and interposed between the heat radiating member and the case.

13. The power module according to claim 8, wherein:
    the power circuit section includes a bus bar; and
    the external connection terminal is a part of the bus bar.

14. The power module according to claim 8, further comprising a lid attached to the case,
    wherein the power circuit section is covered with another resin layer.

15. The power module according to claim 8, wherein the power module is an in-vehicle power module.

16. A method for waterproofing a power circuit section disposed on a circuit disposition surface of a heat radiating member, the method comprising:
    forming the power circuit section including an external connection terminal having:
       a standing portion, which stands up from the circuit disposition surface; and
       a extending portion, which extends from an end portion of the standing portion to outside in parallel with the circuit disposition surface;
    manufacturing a case including:
       a hood surrounding an end portion of the extending portion and opening in parallel with the circuit disposition surface;
       a concave portion formed at a bottom portion of the hood, one end portion thereof opening toward a heat radiating member side; and
       an assembling through hole formed at a peripheral wall of the hood on the heat radiating member side, wherein an end portion of the extending portion of the external connection terminal can be inserted into the assembling through hole;
    inserting the external connection terminal into the concave portion and the assembling through hole to accommodate the external connection terminal in the hood and the concave portion, and assembling the case with the heat radiating member in a state where a seal member surrounds a part of the power circuit section except for the external connection terminal and is interposed between the case and the heat radiating member; and
    turning the hood to open upward, and filling a resin into a space surrounded by the concave portion and the heat radiating member up to a height at which the resin covers a base portion of the external connection terminal including the standing portion.

17. The method according to claim 16, wherein the resin is an epoxy resin.

18. The method according to claim 16, wherein in the case manufacturing step, a groove for receiving the standing portion is formed at a bottom portion of the concave portion.

19. The method according to claim 16, wherein in the assembling step, the seal member is formed by heat curing an adhesive including a thermosetting resin.

* * * * *